United States Patent
Zhang et al.

(10) Patent No.: US 12,308,212 B2
(45) Date of Patent: May 20, 2025

(54) IN-SITU ADSORBATE FORMATION FOR PLASMA ETCH PROCESS

(71) Applicant: Tokyo Electron Limited, Tokyo (JP)

(72) Inventors: Du Zhang, Albany, NY (US); Yu-Hao Tsai, Albany, NY (US); Masahiko Yokoi, Miyagi (JP); Yoshihide Kihara, Miyagi (JP); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 306 days.

(21) Appl. No.: 17/937,151

(22) Filed: Sep. 30, 2022

(65) Prior Publication Data
US 2024/0112887 A1 Apr. 4, 2024

(51) Int. Cl.
*H01J 37/32* (2006.01)
*H01L 21/311* (2006.01)

(52) U.S. Cl.
CPC .... *H01J 37/3244* (2013.01); *H01L 21/31116* (2013.01); *H01J 37/321* (2013.01); *H01J 37/32724* (2013.01); *H01J 2237/2001* (2013.01); *H01J 2237/3341* (2013.01); *H01J 2237/3345* (2013.01); *H01J 2237/3346* (2013.01)

(58) Field of Classification Search
CPC ............... H01J 37/3244; H01J 37/321; H01J 37/32724; H01J 2237/2001; H01J 2237/3341; H01J 2237/3345; H01J 2237/3346; H01L 21/31116; H01L 21/31144
See application file for complete search history.

(56) References Cited

U.S. PATENT DOCUMENTS

| | | | | | |
|---|---|---|---|---|---|
| 4,352,724 | A * | 10/1982 | Sugishima | .......... | H01L 21/3065 257/E21.037 |
| 6,465,159 | B1 * | 10/2002 | Ni | .......... | H01L 21/76831 430/311 |
| 10,546,756 | B2 * | 1/2020 | Jayanti | .......... | H01L 21/31138 |
| 2004/0222185 | A1 * | 11/2004 | Kawai | .......... | H01L 21/32136 257/E21.252 |
| 2008/0173326 | A1 * | 7/2008 | Gu | .......... | C23C 14/564 134/1.1 |

(Continued)

FOREIGN PATENT DOCUMENTS

EP 0305946 A2 * 3/1989

OTHER PUBLICATIONS

International Search Report and Written Opinion, PCT Application No. PCT/US2023/030844, mailed Dec. 12, 2023, 13 pages.

*Primary Examiner* — Duy Vu N Deo
*Assistant Examiner* — Christopher Remavege
(74) *Attorney, Agent, or Firm* — Slater Matsil, LLP

(57) ABSTRACT

A method of processing a substrate that includes: flowing dioxygen ($O_2$) and an adsorbate precursor into a plasma processing chamber that is configured to hold the substrate including an organic layer and a patterned etch mask; sustaining an oxygen-rich plasma while flowing the $O_2$ and the adsorbate precursor, oxygen species from the $O_2$ and the adsorbate precursor reacting under the oxygen-rich plasma to form an adsorbate; and exposing the substrate to the oxygen-rich plasma to form a recess in the organic layer, where the adsorbate forms a sidewall passivation layer in the recess.

16 Claims, 10 Drawing Sheets

```
┌──────────────────────────────────────────────────────┐
│ FLOW O₂ AND P-CONTAINING ADSORBATE PRECURSOR INTO │─ 712
│           PLASMA PROCESSING CHAMBER                   │
└──────────────────────────────────────────────────────┘
                          │
                          ▼
┌──────────────────────────────────────────────────────┐
│           SUSTAIN OXYGEN-RICH PLASMA                  │─ 722
└──────────────────────────────────────────────────────┘
                          │
                          ▼
┌──────────────────────────────────────────────────────┐
│    REACT OXYGEN AND P-CONTAINING ADSORBATE            │─ 732
│   PRECURSOR TO FORM P-CONTAINING ADSORBATE            │
└──────────────────────────────────────────────────────┘
                          │
                          ▼
┌──────────────────────────────────────────────────────┐
│   EXPOSE SUBSTRATE TO OXYGEN-RICH PLASMA TO FORM      │─ 742
│                       RECESS                          │
└──────────────────────────────────────────────────────┘
```

(56) References Cited

U.S. PATENT DOCUMENTS

| | | | |
|---|---|---|---|
| 2016/0163556 A1* | 6/2016 | Briggs | H01L 21/31116 |
| | | | 156/345.24 |
| 2016/0293441 A1* | 10/2016 | Lee | H10B 43/50 |
| 2018/0350618 A1 | 12/2018 | Hudson et al. | |
| 2019/0051526 A1* | 2/2019 | Khang | H01L 29/7854 |
| 2019/0148402 A1* | 5/2019 | Yoshikawa | H01L 21/32136 |
| | | | 257/324 |
| 2021/0082713 A1 | 3/2021 | Katsunuma et al. | |
| 2021/0143028 A1 | 5/2021 | Yokoyama et al. | |
| 2021/0159089 A1 | 5/2021 | Suda et al. | |
| 2021/0391181 A1 | 12/2021 | Chang et al. | |
| 2022/0375759 A1* | 11/2022 | Kim | H01J 37/32834 |

\* cited by examiner

IN-SITU ADSORBATE FORMATION FOR PLASMA ETCH PROCESS

TECHNICAL FIELD

The present invention relates generally to methods of processing a substrate, and, in particular embodiments, to neutral adsorption enhancement via in-situ adsorbate formation.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method of processing a substrate that includes: flowing dioxygen ($O_2$) and an adsorbate precursor into a plasma processing chamber that is configured to hold the substrate including an organic layer and a patterned etch mask; sustaining an oxygen-rich plasma while flowing the $O_2$ and the adsorbate precursor, oxygen species from the $O_2$ and the adsorbate precursor reacting under the oxygen-rich plasma to form an adsorbate; and exposing the substrate to the oxygen-rich plasma to form a recess in the organic layer, where the adsorbate forms a sidewall passivation layer in the recess.

In accordance with an embodiment of the present invention, a method of processing a substrate that includes: flowing a P-containing adsorbate precursor and a halogen-free gas including dioxygen ($O_2$) into a plasma processing chamber that is configured to hold the substrate including an organic layer and a patterned etch mask, where a ratio of a flow rate of $O_2$ to a flow rate of the P-containing adsorbate precursor is at least 1:1; sustaining an oxygen-rich plasma while flowing the P-containing adsorbate precursor and the halogen-free gas, oxygen species from the $O_2$ and the P-containing adsorbate precursor reacting under the oxygen-rich plasma to form a P-containing adsorbate; and exposing the substrate to the oxygen-rich plasma to form a recess in the organic layer, where the P-containing adsorbate forms a sidewall passivation layer in the recess.

In accordance with an embodiment of the present invention, a method of processing a substrate that includes: loading the substrate in a plasma processing chamber, the substrate including a dielectric layer, an amorphous carbon layer (ACL) and a patterned etch mask; flowing dioxygen ($O_2$), a P-containing adsorbate precursor, and a hydrogen-containing gas into the plasma processing chamber; sustaining a halogen-free plasma in the plasma processing chamber, where a P-containing adsorbate and $H_2O$ are formed under the halogen-free plasma; exposing the substrate to the halogen-free plasma to form a recess in the ACL; and exposing the substrate to a halogen-containing plasma to extend the recess into the dielectric layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C illustrate cross sectional views of a substrate during an example process of semiconductor fabrication comprising a plasma etch process to form a high aspect ratio (HAR) feature on the substrate in accordance with various embodiments, wherein FIG. 1A illustrates an incoming substrate comprising an underlying layer, a material layer, and a patterned mask layer, FIG. 1B illustrates the substrate during the formation of the HAR feature in the material layer by the plasma etch process, and FIG. 1C illustrates the substrate after a subsequent plasma etch process to etch the underlying layer;

FIGS. 2A-2B illustrate cross sectional views of a substrate during the plasma etch process, wherein FIG. 2A illustrates the substrate where etchant species causing lateral etching, and FIG. 2B illustrates the substrate where a passivation layer preventing lateral etching;

FIG. 3A-3B illustrate schematic surface structures of amorphous carbon layer (ACL) with adsorbates, wherein FIG. 3A illustrates $H_2O$ adsorption, and FIG. 3B illustrates $H_3PO_4$ adsorption;

FIGS. 7A-7C illustrate process flow diagrams of methods of semiconductor fabrication comprising a plasma etch process to form a HAR feature in accordance with various embodiments, wherein FIG. 7A illustrates an embodiment, FIG. 7B illustrates an alternate embodiment, and FIG. 7C illustrates yet another embodiment.

DETAILED DESCRIPTION OF ILLUSTRATIVE EMBODIMENTS

Figure 1A:
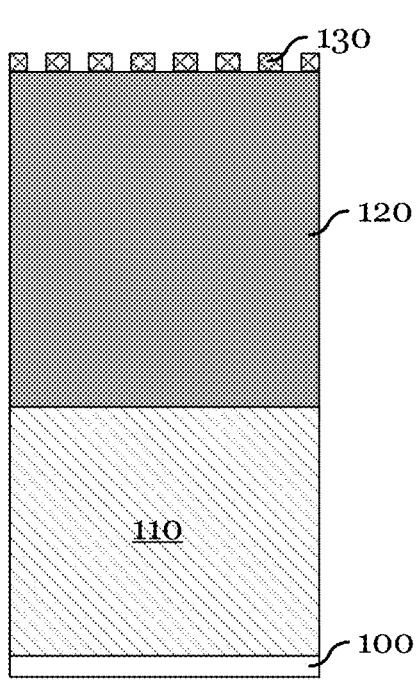

This application relates to fabrication of semiconductor devices, for example, integrated circuits comprising semiconductor devices, and more particularly to high capacity three-dimensional (3D) memory devices, such as a 3D-NAND (or vertical-NAND), 3D-NOR, or dynamic random access memory (DRAM) device. The fabrication of such devices may generally require forming conformal, high aspect ratio (HAR) features (e.g., a contact hole) of a circuit element. Features with aspect ratio (ratio of height of the feature to the width of the feature) higher than 20:1 are generally considered to be high aspect ratio features, and in some cases fabricating a higher aspect ratio such as 100:1 may be desired for advanced 3D semiconductor devices. In such applications, HAR features may be formed in a dielectric layer (e.g., silicon oxide, silicon nitride, or oxide/nitride layer stack) by a highly anisotropic plasma etch process with high fidelity. To enable ideal etch performance for HAR features, an etch mask, for example, amorphous carbon layer (ACL), must with a HAR also be prepared prior to etching the dielectric layer. This etch process for the etch mask (e.g., ACL) may be based on $O_2$-sulfur chemistry to achieve highly vertical etch profile and high etch rate with minimal irregularities (e.g., contact edge roughness, line edge roughness, and/or line width roughness). However, the use of sulfur in the etch process, although helpful in passivating sidewalls to minimize lateral etching, can cause acidic contamination during the process. Therefore, a new etch method that does not require sulfur may be desired for patterning an etch mask with high aspect ratio (HAR) features. Embodiments of the present application disclose methods of fabricating HAR features by a plasma etch process based on a combination of in-situ adsorbate formation and sidewall passivation by the formed adsorbates.

In various embodiments, phosphorous (P)-containing adsorbates such as $H_3PO_4$ may be formed in a plasma processing chamber during a plasma etch process, and they may advantageously provide sidewall passivation to enable a HAR feature with minimized line wiggling, bowing, and/or twisting. The inventors of this application identified that P-containing adsorbates may exhibit a higher energy of adsorption on a carbon-containing surface than $H_2O$. $H_2O$ may be used as another effective adsorbate for sidewall passivation while etching an organic layer, but generally requires low-temperature conditions (e.g., temperature below 0° C.), which may be costly. Using the P-containing adsorbates in place of, or in addition to, $H_2O$, it may be possible to eliminate the need of such low temperature conditions. In certain embodiments, other types of adsorbates comprising other elements such as B, S, Si, and/or N may also be used.

In the following, an exemplary plasma etch process to form a high aspect ratio (HAR) feature is described in accordance with various embodiments referring to FIGS. 1A-1C. The effect of sidewall passivation by a passivation layer is then described referring to FIGS. 2A-2B. Subsequently, adsorption profiles for $H_2O$ and $H_3PO_4$ are compared referring to FIGS. 3A-3B and 4. Formation of a P-containing adsorbate species is then described referring to FIGS. 5-7. Example process flow diagrams are then illustrated in FIGS. 8A-8C. FIG. 9 provides an example inductively coupled plasma (ICP) system for performing a process of semiconductor fabrication in accordance with various embodiments. All figures are drawn for illustration purpose only and not to scale, including the aspect ratios of features.

FIGS. 1A-1D illustrate cross sectional views of a substrate during an example process of semiconductor fabrication comprising a plasma etch process to form a high aspect ratio (HAR) feature on the substrate in accordance with various embodiments.

FIG. 1A illustrates an incoming substrate 100 comprising an underlying layer 110, a material layer 120, and a patterned mask layer 130.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate.

In various embodiments, the substrate 100 is a part of, or include, a semiconductor device, and may have undergone a number of steps of processing following, for example, a conventional process. For example, the semiconductor structure may comprise a substrate 100 in which various device regions are formed. At this stage, the substrate 100 may include isolation regions such as shallow trench isolation (STI) regions as well as other regions formed therein.

The underlying layer 110 may be formed over the substrate 100. In various embodiments, the underlying layer 110 is a target layer that is to be patterned by a subsequent plasma etch process after patterning the material layer 120. In certain embodiments, the feature being etched into the underlying layer 110 may be a contact hole, slit, or other suitable structures comprising a recess. In various embodiments, the underlying layer 110 may comprise a dielectric material. In certain embodiments, the underlying layer 110 may be a silicon oxide layer. In alternate embodiments, the underlying layer 110 may comprise silicon nitride, silicon oxynitride, or an O/N/O/N layer stack (stacked layers of oxide and nitride). The underlying layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the underlying layer 110 has a thickness between 1 μm and 10 μm.

Still referring to FIG. 1A, the material layer 120 is formed over the underlying layer 110. In various embodiments, the material layer 120 may comprise amorphous carbon layer (ACL). In certain embodiments, the material layer 120 may comprise a layer stack of multiple mask materials (e.g., soft ACL and hard ACL). The material layer 120 may be deposited using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The relative thicknesses of the material layer 120 and the underlying layer 110 may have any suitable relationship. For example, the material layer 120 may be thicker than the underlying layer 110, thinner than the underlying layer 110, or the same thickness as the underlying layer 110. In certain embodiments, the material layer 120 has a thickness between 1 μm and 4 μm. In one embodiment, the material layer 120 comprises amorphous carbon layer (ACL) and has a thickness of 2.5 μm. In various embodiments, the material layer 120 is the layer to be patterned to form HAR features by the plasma etch process.

Further illustrated in FIG. 1A, the substrate 100 may comprise the patterned mask layer 130 over the material layer 120. In various embodiments, the patterned mask layer 130 may comprise a silicon mask material, such as silicon oxynitride (SiON). The patterned mask layer 130 may be formed by first depositing a mask layer using, for example, an appropriate vapor deposition technique such as chemical vapor deposition (CVD), physical vapor deposition (PVD), atomic layer deposition (ALD), as well as other plasma processes such as plasma enhanced CVD (PECVD) and other processes. The deposited mask layer may then be patterned using a lithography process and an anisotropic etch process.

Although not specifically illustrated in FIG. 1A, the substrate 100 may also comprise other layers. For example, for the purpose of patterning the mask layer, a tri-layer structure comprising a photoresist layer, SiARC layer, and optical planarization layer (OPL) may be present.

Fabricating the HAR feature in the material layer 120 may be performed by a plasma etch process based on $O_2$ etch chemistry. In various embodiments, an oxygen-containing gas such as dioxygen ($O_2$) may be used as a primary etch gas. In certain embodiments, the plasma for the plasma etch process may be an oxygen-rich and halogen-free plasma. In one or more embodiments, the plasma may be a fluorine-free plasma. In addition, an adsorbate precursor may be included in a process gas such that, under a plasma condition, an adsorbate may be formed in a plasma processing chamber. In various embodiments, the adsorbate may comprise phosphorous. In one or more embodiments, the adsorbate formed in the plasma chamber may comprise phosphoric acid ($H_3PO_4$). The inventors of this application identified that $H_3PO_4$ may be an effective adsorbate that provides sidewall passivation. However, $H_3PO_4$ is nonvolatile and it is therefore impractical to directly deliver it in a gas phase to the plasma processing chamber. In various embodiments, the methods deliver an adsorbate precursor to enable in-situ formation of the adsorbate in the plasma processing chamber. The in-situ formation of adsorbate such as $H_3PO_4$ can overcome the issue of nonvolatility. Accordingly, the adsorbate precursor may comprise phosphorous. Examples of the P-containing adsorbate precursor include $PH_3$ and $PCl_3$.

In other embodiments, the adsorbate may comprise other elements such as B, S, Si, and/or N, and the adsorbate precursor may accordingly comprise these elements. In certain embodiment, the adsorbate precursor may comprise $B_2H_6$, $Si_xH_y$, $H_2S$, or $NH_3$. Accordingly, the adsorbate formed in the plasma chamber may comprise boric acid, silicic acid, sulfuric acid, nitric acid, or similar acidic molecules comprising B, S, Si, and/or N. These acidic molecules may be exposed to behave similarly to phosphoric acid ($H_3PO_4$) and thereby function as an effective adsorbate for sidewall passivation.

In one or more embodiments, in addition to the adsorbate precursor, the process gas may further comprise a hydrogen-containing gas such as water ($H_2O$), dihydrogen ($H_2$), a hydrocarbon (e.g., $CH_4$), or hydrogen peroxide ($H_2O_2$). The hydrogen-containing as may act as another adsorbate precursor and/or co-adsorbate. In certain embodiments, other gases such as a noble gas and/or a balancing agent may also be added.

The addition of the hydrogen-containing gas in the process gas may also benefit the etch rate, which may in turn enable a shorter process time compared to conventional HAR etch methods. Although not wishing to be limited by any theory, the addition of the hydrogen-containing gas (e.g., $H_2$) may advantageously enhance the dissociation of $O_2$ in the plasma and increase the number of reactive species such as oxygen radical.

Further, in various embodiments, adsorbates may comprise neutral species in a plasma system and effective in surface modification/activation during a plasma etch process such as reactive ion etching (RIE). By increasing the amount of neutrals in the plasma, the methods may advantageously enhance the etch rate. Further, the neutral adsorbate may also provide sidewall passivation that improve the anisotropy of the plasma etch process.

Figure 1B:
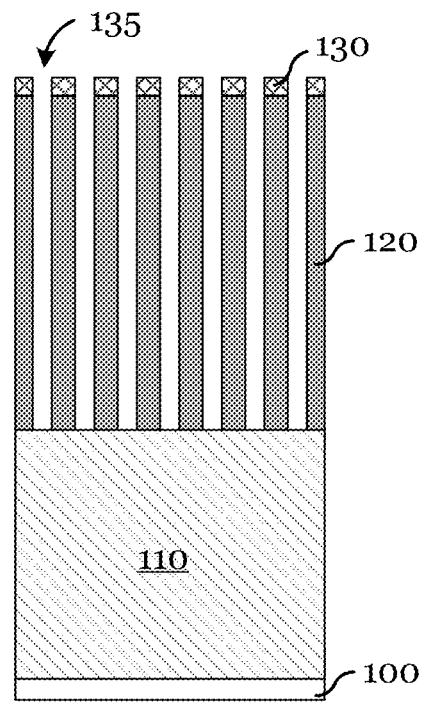

FIG. 1B illustrates the substrate 100 during the formation of the HAR feature in the material layer 120 by the plasma etch process.

In FIG. 1B, the high aspect ratio (HAR) feature is formed as recesses 135 in the material layer 120 by the plasma etch process. As illustrated in FIG. 1B, the recesses 135 may be formed straight and uniformly across the substrate 100 with a minimal level of bowing. Bowing refers to the deviation of a perfectly straight recess from a purely anisotropic profile to a recess having outward curvature. Bowing may generally occur near the top of sidewalls of the etch target (e.g., the material layer 120), and may be caused by the bending of incident ion trajectories of ions used during the plasma etching process. Bowing may be eliminated or minimized by the sidewall passivation in the recess 135, as further illustrated below referring to FIGS. 2A and 2B.

In various embodiments, process parameters may be selected to optimize the characteristics of the high aspect ratio (HAR) feature considering various factors comprising etch rate, selectivity to the etch mask (e.g., the patterned mask layer 130), sidewall passivation in the HAR feature, and good critical dimension uniformity (CDU) among others. The process parameters may comprise gas selection, gas flow rates, pressure, temperature, process time, and plasma conditions such as source power, bias power, RF pulsing conditions.

In certain embodiments, a ratio of a flow rate of the oxygen-containing gas (e.g., $O_2$) to a flow rate of the adsorbate precursor (e.g., $PH_3$) may be between 100:1 and 1:1. In one or more embodiments, the ratio of the flow rate may be between 20:1 and 10:1. In various embodiments, the gas composition and their flow rates may be selected to obtain an oxygen-rich plasma for the plasma etch process, which can be generally used for etching carbon materials such as ACL. In the oxygen-rich plasma, reactive species are predominantly oxygen-containing species, where the amount of oxygen-absent species are not greater than that of oxygen-containing species. The inventors of this application identified that the particular combination of $O_2$ and an adsorbate precursor (e.g., $PH_3$) can be critical in sufficiently providing the effect of adsorbates during etching carbon materials such as ACL.

In certain embodiments, the plasma may be an oxygen-rich, halogen-free plasma. In another embodiment, the plasma may be formed from a halogen-free gas comprising dioxygen ($O_2$), while the adsorbate precursor may be the only halogen-containing gas among the gases flowed into the plasma processing chamber. Avoiding halogen for the methods of etching carbon materials such as ACL may be particularly advantageous for fabricating HAR structures, for example, for 3D-NAND devices. This is because such a fabrication process typically involves (1) ACL patterning, followed by (2) a dielectric etch using the patterned ACL as an etch mask, and halogen-free etch chemistry in the ACL patterning can provide better etch selectivity to the etch mask for ACL patterning (e.g., the patterned mask layer 130 in FIG. 1A, for example, SiON) and an underlying dielectric layer (e.g., the underlying layer 110 in FIG. 1A, for example, $SiO_2$, $Si_3N_4$, or O/N/ON stack structures). The ACL patterning may typically be performed using an inductively-coupled plasma (ICP) system. On the other hand, the subsequent dielectric etch may use a halogen-based etch chemistry, for example, using fluorine species as a main etchant, in order to effectively etch Si-containing materials (e.g., SiON and $SiO_2$). The subsequent dielectric etch may typically be performed using a capacitively-coupled plasma (CCP) system.

In various embodiments, the substrate temperature may be kept at room temperature during the plasma etch process.

The recesses 135 may be in any shapes and structures, including a contact hole, slit, or other suitable structures comprising a recess useful for semiconductor device fabrication. In various embodiments, the features defined by the recesses 135 has a critical dimension (CD) of 200 nm or less. In certain embodiments, the CD may be between 50 nm and 200 nm. For example, the feature may comprise a slit with a CD of about 150 nm. In alternate embodiments, the recesses 135 may comprise a hole that has a top opening with a diameter of 80 nm or less.

Figure 1C:
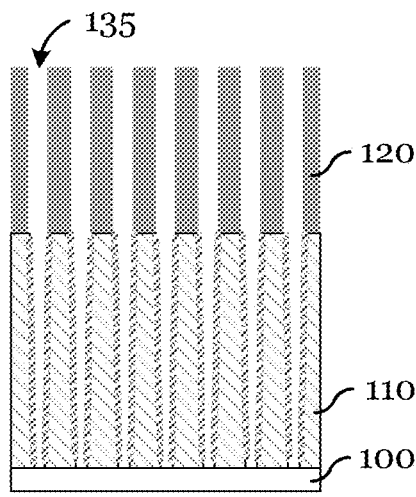

FIG. 1C illustrates the substrate 100 after a subsequent plasma etch process to etch the underlying layer 110.

The HAR feature in the material layer 120 prepared in FIG. 1B may be used as an etch mask layer for the subsequent plasma etch to form another HAR feature in the underlying layer 110. In various embodiments, the underlying layer 110 may comprise a dielectric material such as silicon oxide and may be etched based on fluorine-based chemistry. In certain embodiments, one or more fluorocarbons may be used as a primary etch gas. For example, a saturated fluorocarbon, an unsaturated fluorocarbon, or a combination thereof may be included in a process gas. In this disclosure, an unsaturated fluorocarbon refers to any compound comprising carbon and fluorine with at least one carbon-carbon double bond (C=C bond) or triple bond (CC bond), and a saturated fluorocarbon refers to any compound comprising carbon and fluorine without any C=C bond or CC bond. In certain embodiments, the unsaturated fluorocarbon may comprise hexafluorobutadiene ($C_4F_6$), hexafluoro-2-butyne ($C_4F_6$), or hexafluorocyclobutene ($C_4F_6$), and the saturated fluorocarbon may comprise octafluoropropane ($C_3F_8$), perfluorobutane ($C_4F_{10}$), or perflenapent ($C_5F_{12}$). In various embodiments, other gases such as a noble gas and/or a balancing agent may also be added. For example, in certain embodiments, argon (Ar) and dioxygen ($O_2$) may be included as the noble gas and the balancing agent, respectively. In alternate embodiments, the combination of gases may further comprise a third fluorocarbon. In one embodiment, the third fluorocarbon may be octafluorocyclobutane ($C_4F_8$), octafluoro-2-butene ($C_4F_8$), hexafluoropropylene ($C_3F_6$), carbon tetrafluoride ($CF_4$), or fluoroform ($CHF_3$).

As illustrated in FIG. 1C, the subsequent plasma etch process may extend the recesses 135 so that it reaches to the top surface of the substrate 100. Accordingly, the subsequent plasma etch process in accordance with various embodiments may provide a good selectivity to silicon (Si) in addition to the mask (e.g., the material layer 120). Consequently, the formation of the recesses 135 may advantageously stop at the top surface of the substrate 100. In certain embodiments, a polymer deposition on the exposed surface of the substrate 100 may advantageously function as an etch stop layer.

In certain embodiments, the subsequent plasma etch process may be advantageously performed as a continuous process with a process time of 60 min or less to form a high aspect ratio (HAR) feature in the underlying layer 110 with an aspect ratio of 20:1 or higher. Further processing may follow conventional processing, for example, by removing any remaining portion of the material layer 120.

In various embodiments, the plasma etch process for the material layer 120 (FIG. 1B) may be performed in a plasma system (e.g., an ICP tool), and the subsequent plasma the etch process for the underlying layer 110 may be performed in another plasma system (e.g., a CCP tool). In alternate embodiments, both two plasma etch processes may be performed in a same plasma system.

Figure 2A:
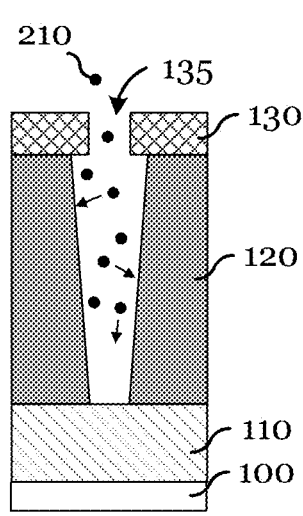
Figure 2B:
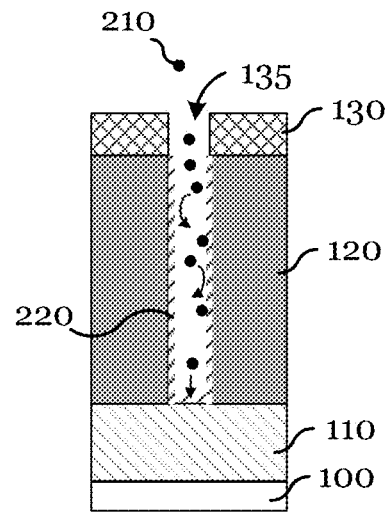

FIGS. 2A-2B illustrate cross sectional views of a substrate 100 during the plasma etch process. FIG. 2A illustrates the substrate 100 where etchant species causing lateral etching, and FIG. 2B illustrates the substrate 100 where a passivation layer 220 preventing lateral etching. The structure of the substrate 100 may be identical to those illustrated in FIGS. 1A-1C, and thus will not be repeated.

In FIG. 2A, the substrate 100 is illustrated after performing a plasma etch process in the absence of sidewall passivation of a recess 135. In this example, when etchants 210 (e.g., oxygen species) in the plasma impinge on the sidewalls of the recess 135, they may cause lateral etching, which may then lead to the widening of the recesses 135. Since the degree of lateral etching may vary at different depth of the recess 135, the sidewall of the recess 135 may not be straight. It may be tapered as illustrated in FIG. 2A and/or bowed. Consequently, the HAR feature of the material layer 120 may suffer line wiggling and/or pattern collapse. To avoid such issues, in various embodiments, the sidewall passivation may be enabled and improved by adding a hydrogen-containing gas in the process gas.

In FIG. 2B, the substrate 100 is illustrated after performing a plasma etch process with the sidewall passivation of a recess 135. The sidewall passivation may be achieved by forming the passivation layer 220 comprising the adsorbate (e.g., $H_3PO_4$). The passivation layer 220 protects the sidewalls of the recess 135 from the etchants 210.

Figure 3A:
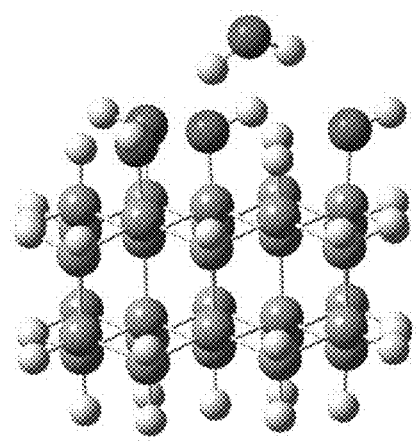
Figure 3B:
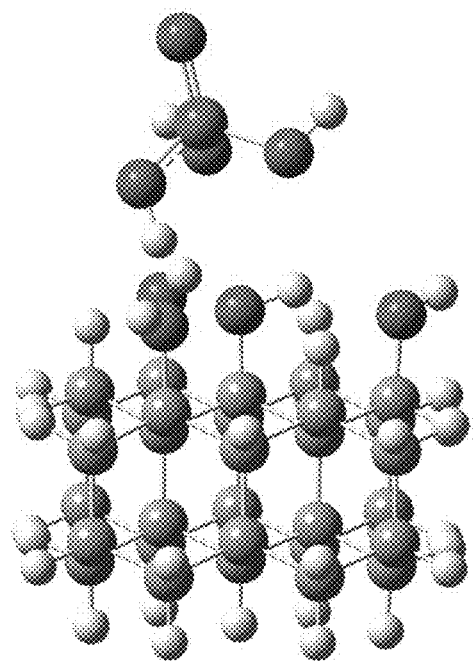

FIG. 3A-3B illustrate schematic surface structures of amorphous carbon layer (ACL) with adsorbates.

Figure 4:
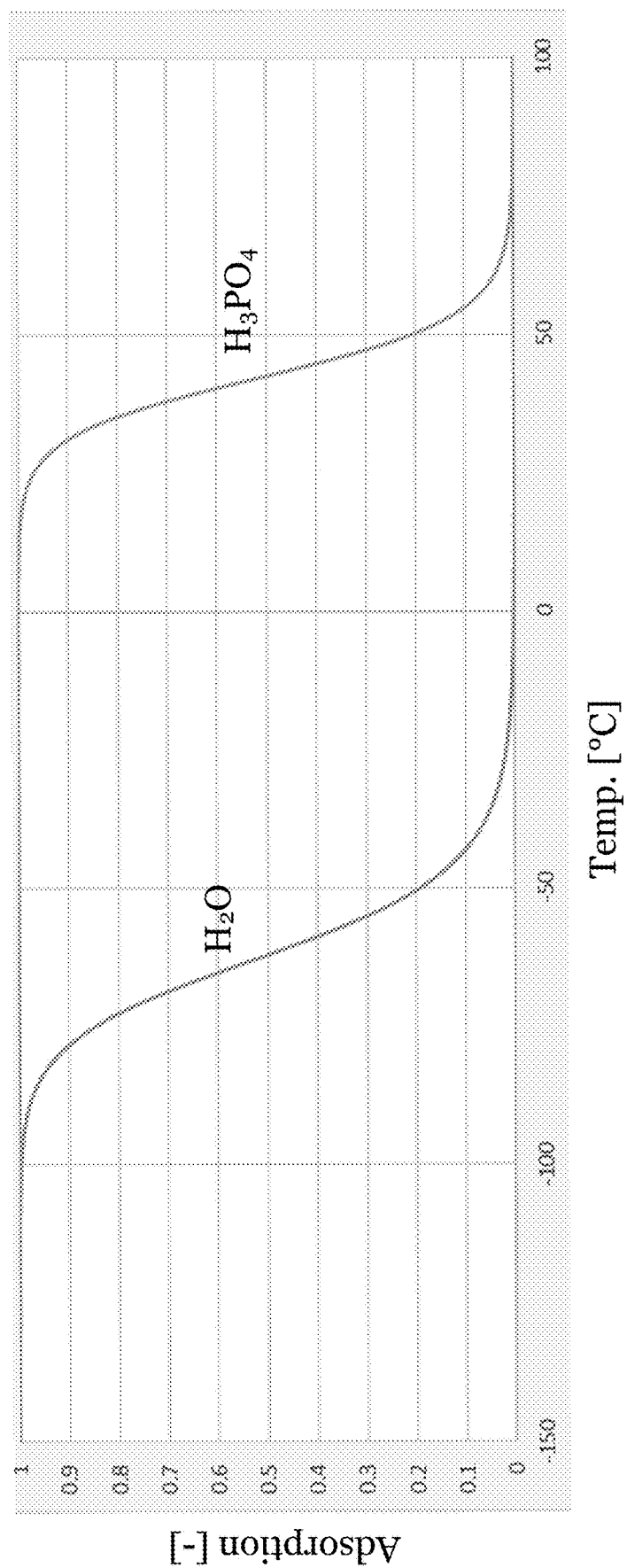
FIG. 4 illustrates a simulated surface coverage by adsorbates as a function of temperature.

FIG. 4 illustrates a simulated surface coverage by adsorbates as a function of temperature.

The inventors of this disclosure identified a P-containing adsorbate may be advantageous in providing sidewall passivation without low-temperature conditions through quasi-continuum density functional theory (QC-DFT) simulations. Two modes of adsorption are compared: $H_2O$ adsorption on C—OH surface (FIG. 3A) and $H_3PO_4$ adsorption on C—OH surface (FIG. 3B). The simulated energy of adsorption ($E_{ads}$) is −0.481 eV for $H_2O$ adsorption, and −1.1684 eV for $H_3PO_4$ adsorption, indicating stronger physisorption of $H_3PO_4$ occurs compared to $H_2O$. Based on this result, Langmuir surface coverage as a function of temperature is plotted in FIG. 4 for these two modes of adsorption. The plots suggest that while a temperature of −50° C. may be required for the $H_2O$ physisorption to reach about 20% surface coverage, a same level of coverage is possible with $H_3PO_4$ at a temperature of 50° C. Accordingly, in various embodiments, the methods may use a P-adsorbate for sidewall passivation at a temperature higher than 0° C., which may offer an advantage over $H_2O$-based sidewall passivation.

Figure 5:
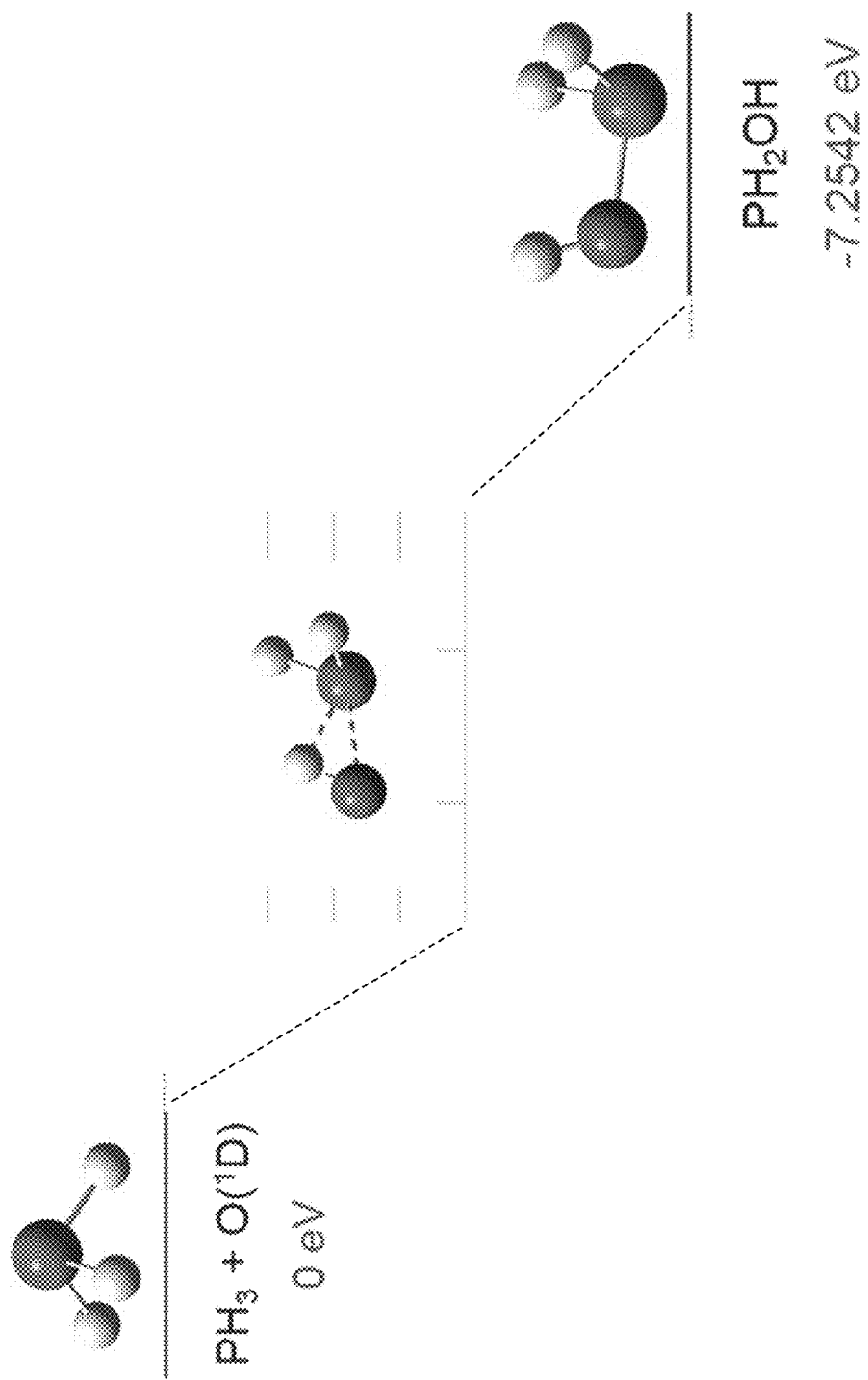
FIG. 5 illustrates steps of $PH_2OH$ formation starting from $PH_3$ and $O(^1D)$.

FIG. 5 illustrates steps of $PH_2OH$ formation starting from $PH_3$ and $O(^1D)$.

Figure 6:
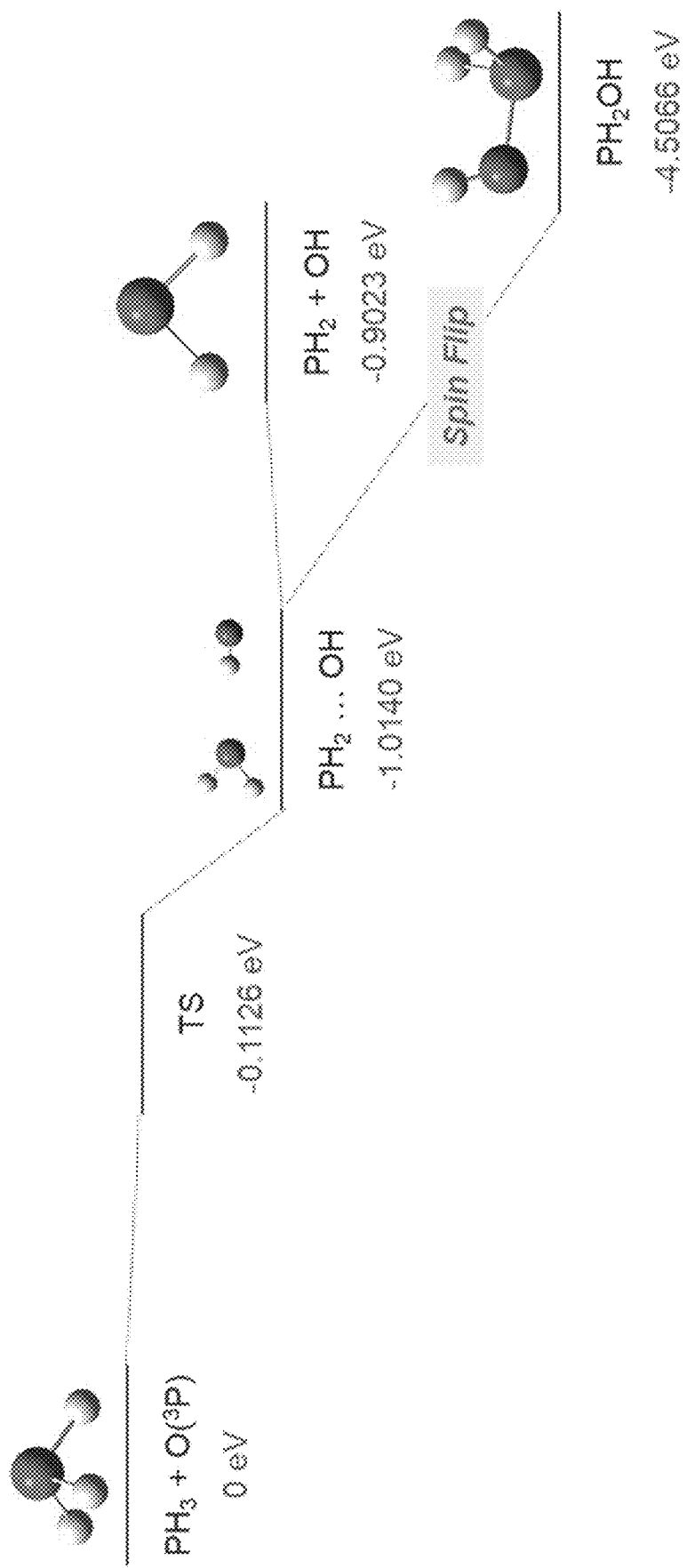
FIG. 6 illustrates steps of $PH_2OH$ formation starting from $PH_3$ and $O(^3P)$.

FIG. 6 illustrates steps of $PH_2OH$ formation starting from $PH_3$ and $O(^3P)$.

Further simulations were conducted to calculate formation energies for an example P-adsorbate, $PH_2OH$. The calculate energy of in-situ formation is −7.2542 eV when starting from $PH_3$ and $O(^1D)$ (FIG. 5), and −4.5066 eV when starting from $PH_3$ and $O(^3P)$ (FIG. 6). The notations of $^1D$ and $^3P$ refer to the spin state of the atomic oxygen O. The symbol $^1D$ represents a meta-stable excited state wave function for the electronic structure of atomic oxygen, and the symbol $^3P$ represents the ground state wave function. Both species are abundantly present in the oxygen-based plasma, thus providing various different chemical pathways of $PH_3$ oxidation and eventually acid formation (e.g., $PH_2OH$). These results confirm the favorable thermodynamic for the in-situ formation of $PH_2OH$.

Figure 7A:
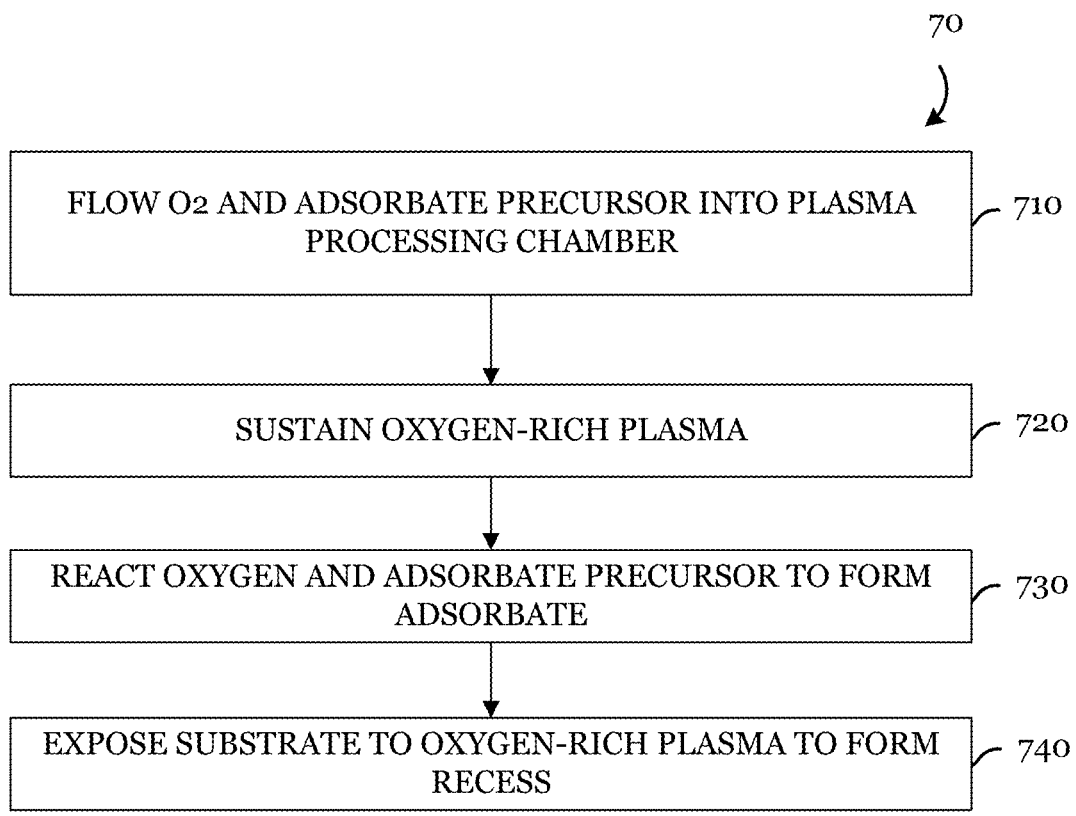
Figure 7B:
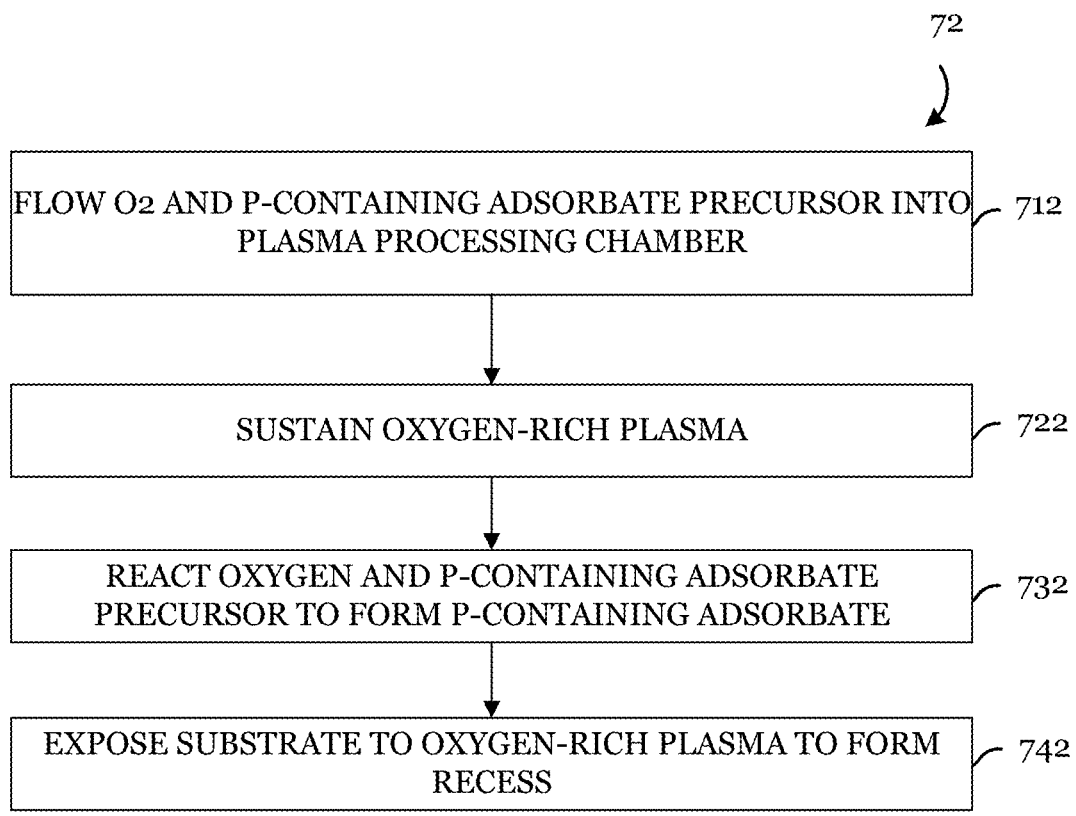
Figure 7C:
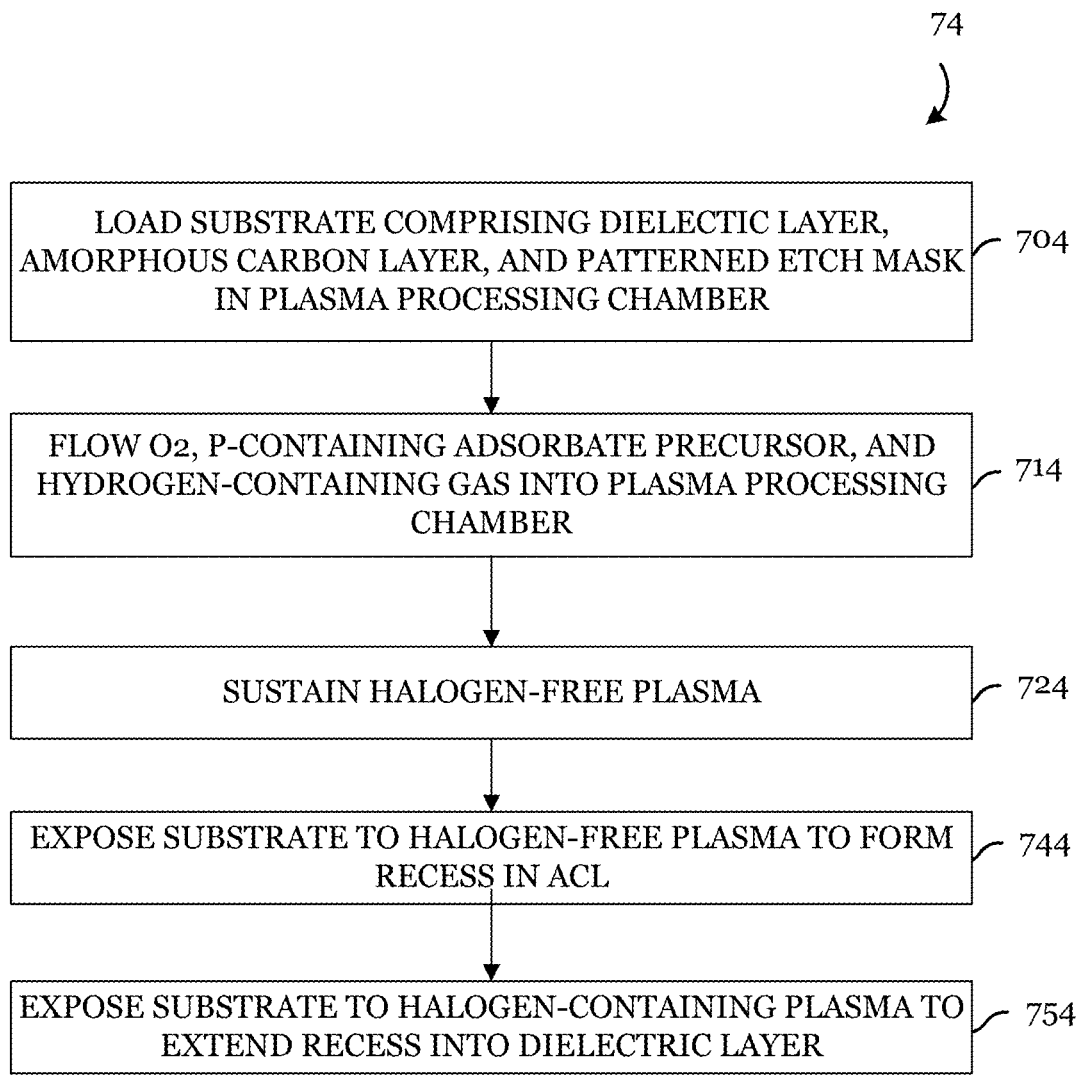

FIGS. 7A-7C illustrate process flow diagrams of methods of semiconductor fabrication comprising a plasma etch process to form a HAR feature in accordance with various embodiments. The process flow can be followed with the figures discussed above (e.g., FIGS. 1A-1C) and hence will not be described again.

In FIG. 7A, in accordance with some embodiments, a process flow 70 may start with flowing dioxygen ($O_2$) and an adsorbate precursor (e.g., $PH_3$) into a plasma processing chamber that holds a substrate comprising an organic layer and a patterned etch mask (block 710, FIG. 1A). Next an oxygen-rich plasma may be generated while flowing the $O_2$ and the adsorbate precursor (block 720). Subsequently, oxygen species from $O_2$ and the adsorbate precursor may be reacted under the oxygen-rich plasma to form an adsorbate (e.g., $H_3PO_4$) (block 730). The substrate may then be exposed to the oxygen-rich plasma to form a recess in the organic layer, where the adsorbate forming a sidewall passivation layer in the recess (block 740, FIG. 1B).

In FIG. 7B, in accordance with alternate embodiments, a process flow 72 may start with flowing a P-containing adsorbate precursor and a halogen-free gas comprising dioxygen ($O_2$) into a plasma processing chamber that holds a substrate comprising an organic layer and a patterned etch mask, where a ratio of a flow rate of $O_2$ to a flow rate of the P-containing adsorbate precursor is at least 1:1 (block 712, FIG. 1A). Next, an oxygen-rich plasma may be generated while flowing the P-containing adsorbate precursor and the halogen-free gas (block 722). Subsequently, oxygen species from $O_2$ and the P-containing adsorbate precursor may be reacted under the oxygen-rich plasma to form a P-containing adsorbate (block 732). The substrate may then be exposed to the oxygen-rich plasma to form a recess in the organic layer, where the adsorbate forms a sidewall passivation layer in the recess (block 742, FIG. 1B).

In FIG. 7C, in accordance with yet other embodiments, a process flow 84 may start with loading the substrate in a plasma processing chamber, where the substrate comprises a dielectric layer, an amorphous carbon layer (ACL) and a patterned etch mask (block 804, FIG. 1A). Next, dioxygen ($O_2$), a P-containing adsorbate precursor, and a hydrogen-containing gas may be flowed into a plasma processing chamber (block 714), followed by generating a halogen-free plasma in the plasma processing chamber, where a P-containing adsorbate and $H_2O$ are formed under the plasma (block 724). Subsequently, the substrate may be exposed to the halogen-free plasma to form a recess in the ACL (block 744, FIG. 1B), and then exposed to a halogen-containing plasma to extend the recess into the dielectric layer (block 754, FIG. 1C).

Figure 8:
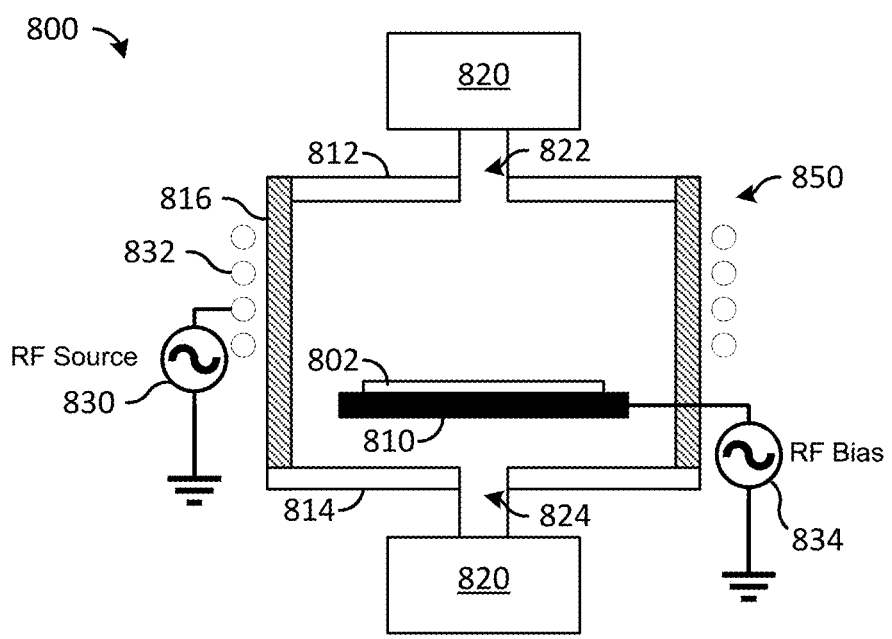
FIG. 8 illustrates a plasma system for performing a process of semiconductor fabrication in accordance with various embodiments.

FIG. 8 illustrates a plasma system 800 for performing a process of semiconductor fabrication in accordance with various embodiments.

FIG. 8 illustrates the plasma system 800 for performing a plasma etch process, for example, as illustrated in the flow diagrams in FIGS. 7A-7C. The plasma system 800 has a plasma processing chamber 850 configured to sustain plasma directly above a substrate 802 loaded onto a substrate holder 810. A process gas may be introduced to the plasma processing chamber 850 through a gas inlet 822 and may be pumped out of the plasma processing chamber 850 through a gas outlet 824. The gas inlet 822 and the gas outlet 824 may comprise a set of multiple gas inlets and gas outlets, respectively. The gas flow rates and chamber pressure may be controlled by a gas flow control system 820 coupled to the gas inlet 822 and the gas outlet 824. The gas flow control system 820 may comprise various components such as high pressure gas canisters, valves (e.g., throttle valves), pressure sensors, gas flow sensors, vacuum pumps, pipes, and electronically programmable controllers. An RF bias power source 834 and an RF source power source 830 may be coupled to respective electrodes of the plasma processing chamber 850. The substrate holder 810 may also be the electrode coupled to the RF bias power source 834. The RF source power source 830 is shown coupled to a helical electrode 832 coiled around a dielectric sidewall 816. In FIG. 8, the gas inlet 822 is an opening in a top plate 812 and the gas outlet 824 is an opening in a bottom plate 814. The top plate 812 and bottom plate 814 may be conductive and electrically connected to the system ground (a reference potential).

The plasma system 800 is by example only. In various alternative embodiments, the plasma system 800 may be configured to sustain inductively coupled plasma (ICP) with RF source power coupled to a planar coil over a top dielectric cover, or capacitively coupled plasma (CCP) sustained using a disc-shaped top electrode in the plasma processing chamber 850. Alternately, other suitable configurations such as electron cyclotron resonance (ECR) plasma sources and/or a helical resonator may be used. The RF-bias power source 570 may be used to supply continuous wave (CW) or pulsed RF power to sustain the plasma. Gas inlets and outlets may be coupled to sidewalls of the plasma processing chamber, and pulsed RF power sources and pulsed DC power sources may also be used in some embodiments. In various embodiments, the RF power, chamber pressure, substrate temperature, gas flow rates and other plasma process parameters may be selected in accordance with the respective process recipe.

Although not described herein, embodiments of the present invention may be also applied to remote plasma systems as well as batch systems. For example, the substrate holder may be able to support a plurality of wafers that are spun around a central axis as they pass through different plasma zones.

Example embodiments of the invention are summarized here. Other embodiments can also be understood from the entirety of the specification as well as the claims filed herein.

Example 1. A method of processing a substrate that includes: flowing dioxygen ($O_2$) and an adsorbate precursor into a plasma processing chamber that is configured to hold the substrate including an organic layer and a patterned etch mask; sustaining an oxygen-rich plasma while flowing the $O_2$ and the adsorbate precursor, oxygen species from the $O_2$ and the adsorbate precursor reacting under the oxygen-rich plasma to form an adsorbate; and exposing the substrate to the oxygen-rich plasma to form a recess in the organic layer, where the adsorbate forms a sidewall passivation layer in the recess.

Example 2. The method of example 1, where the organic layer includes amorphous carbon layer (ACL).

Example 3. The method of one of examples 1 or 2, where the adsorbate includes $H_3PO_4$, and where the adsorbate precursor includes phosphorous.

Example 4. The method of one of examples 1 to 3, where the adsorbate precursor includes $PH_3$ or $PCl_3$.

Example 5. The method of one of examples 1 to 4, where the adsorbate includes boron.

Example 6. The method of one of examples 1 to 5, where the adsorbate includes silicon halide.

Example 7. The method of one of examples 1 to 6, where the adsorbate includes sulfur.

Example 8. The method of one of examples 1 to 7, where the adsorbate includes nitrogen.

Example 9. The method of one of examples 1 to 8, further including flowing a H-containing gas.

Example 10. The method of one of examples 1 to 9, where the H-containing gas includes water vapor ($H_2O$), hydrogen peroxide ($H_2O_2$), dihydrogen ($H_2$), or hydrogen bromide (HBr).

Example 11. The method of one of examples 1 to 10, further including maintaining a substrate temperature above 0° C. while exposing the substrate to the oxygen-rich plasma.

Example 12. A method of processing a substrate that includes: flowing a P-containing adsorbate precursor and a halogen-free gas including dioxygen ($O_2$) into a plasma processing chamber that is configured to hold the substrate including an organic layer and a patterned etch mask, where a ratio of a flow rate of $O_2$ to a flow rate of the P-containing adsorbate precursor is at least 1:1; sustaining an oxygen-rich plasma while flowing the P-containing adsorbate precursor and the halogen-free gas, oxygen species from the $O_2$ and the P-containing adsorbate precursor reacting under the oxygen-rich plasma to form a P-containing adsorbate; and exposing the substrate to the oxygen-rich plasma to form a recess in the organic layer, where the P-containing adsorbate forms a sidewall passivation layer in the recess.

Example 13. The method of example 12, further including flowing a noble gas into the plasma processing chamber.

Example 14. The method of one of examples 12 or 13, where the oxygen-rich plasma is an inductively coupled plasma (ICP).

Example 15. The method of one of examples 12 to 14, where the recess has an aspect ratio of at least 20:1.

Example 16. The method of one of examples 12 to 15, further including flowing water vapor ($H_2O$), hydrogen peroxide ($H_2O_2$), dihydrogen ($H_2$), or hydrogen bromide (HBr).

Example 17. A method of processing a substrate that includes: loading the substrate in a plasma processing chamber, the substrate including a dielectric layer, an amorphous carbon layer (ACL) and a patterned etch mask; flowing dioxygen ($O_2$), a P-containing adsorbate precursor, and a hydrogen-containing gas into the plasma processing chamber; sustaining a halogen-free plasma in the plasma processing chamber, where a P-containing adsorbate and $H_2O$ are formed under the halogen-free plasma; exposing the substrate to the halogen-free plasma to form a recess in the ACL; and exposing the substrate to a halogen-containing plasma to extend the recess into the dielectric layer.

Example 18. The method of example 17, where a portion of the recess in the dielectric layer has an aspect ratio of at least 20:1.

Example 19. The method of one of examples 17 or 18, where the dielectric layer includes silicon oxide or silicon nitride.

Example 20. The method of one of examples 17 to 19, where the recess defines a feature having a critical dimension between 50 nm and 200 nm.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
    flowing dioxygen ($O_2$) and an adsorbate precursor into a plasma processing chamber that is configured to hold the substrate comprising an organic layer and a patterned etch mask, the adsorbate precursor comprising phosphorus;
    sustaining an oxygen-rich plasma while flowing the $O_2$ and the adsorbate precursor, oxygen species from the $O_2$ and the adsorbate precursor reacting to form an adsorbate within the oxygen-rich plasma; and
    after forming the adsorbate within the oxygen-rich plasma, exposing the substrate to the oxygen-rich plasma to form a recess in the organic layer, wherein, during the exposing, the adsorbate deposits to form a sidewall passivation layer on sidewalls of the recess.

2. The method of claim 1, wherein the organic layer comprises amorphous carbon layer (ACL).

3. The method of claim 1, wherein the adsorbate comprises $H_3PO_4$.

4. The method of claim 1, wherein the adsorbate precursor comprises $PH_3$ or $PCl_3$.

5. The method of claim 1, further comprising flowing a H-containing gas.

6. The method of claim 5, wherein the H-containing gas comprises water vapor ($H_2O$), hydrogen peroxide ($H_2O_2$), dihydrogen ($H_2$), or hydrogen bromide (HBr).

7. The method of claim 1, further comprising maintaining a substrate temperature above 0° C. while exposing the substrate to the oxygen-rich plasma.

8. A method of processing a substrate, the method comprising:
    flowing a P-containing adsorbate precursor and a halogen-free gas comprising dioxygen ($O_2$) into a plasma processing chamber that is configured to hold the substrate comprising an organic layer and a patterned etch mask, wherein a ratio of a flow rate of $O_2$ to a flow rate of the P-containing adsorbate precursor is at least 1:1;
    sustaining an oxygen-rich plasma while flowing the P-containing adsorbate precursor and the halogen-free gas, oxygen species from the $O_2$ and the P-containing adsorbate precursor reacting under the oxygen-rich plasma to form a P-containing adsorbate; and
    exposing the substrate to the oxygen-rich plasma to form a recess in the organic layer, wherein the P-containing adsorbate forms a sidewall passivation layer in the recess.

9. The method of claim 8, further comprising flowing a noble gas into the plasma processing chamber.

10. The method of claim 8, wherein the oxygen-rich plasma is an inductively coupled plasma (ICP).

11. The method of claim 8, wherein the recess has an aspect ratio of at least 20:1.

12. The method of claim 8, further comprising flowing water vapor ($H_2O$), hydrogen peroxide ($H_2O_2$), dihydrogen ($H_2$), or hydrogen bromide (HBr).

13. A method of processing a substrate, the method comprising:
    loading the substrate in a plasma processing chamber, the substrate comprising a dielectric layer, an amorphous carbon layer (ACL) and a patterned etch mask;
    flowing dioxygen ($O_2$), a P-containing adsorbate precursor, and a hydrogen-containing gas into the plasma processing chamber;
    sustaining a halogen-free plasma in the plasma processing chamber, wherein a P-containing adsorbate and $H_2O$ are formed under the halogen-free plasma;
    exposing the substrate to the halogen-free plasma to form a recess in the ACL; and
    exposing the substrate to a halogen-containing plasma to extend the recess into the dielectric layer.

14. The method of claim 13, wherein a portion of the recess in the dielectric layer has an aspect ratio of at least 20:1.

15. The method of claim 13, wherein the dielectric layer comprises silicon oxide or silicon nitride.

16. The method of claim 13, wherein the recess defines a feature having a critical dimension between 50 nm and 200 nm.

\* \* \* \* \*